US008624813B2

(12) United States Patent
Cho et al.

(10) Patent No.: US 8,624,813 B2
(45) Date of Patent: Jan. 7, 2014

(54) GATE DRIVER AND METHOD FOR REPAIRING THE SAME

(75) Inventors: Nam Wook Cho, Gunpo-si (KR); Soo Young Yoon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 2246 days.

(21) Appl. No.: 11/475,926

(22) Filed: Jun. 28, 2006

(65) Prior Publication Data

US 2007/0132700 A1 Jun. 14, 2007

(30) Foreign Application Priority Data

Dec. 8, 2005 (KR) .................. 10-2005-0119372

(51) Int. Cl.
*G09G 3/36* (2006.01)

(52) U.S. Cl.
USPC ............................. 345/93; 345/100; 345/204

(58) Field of Classification Search
USPC .......... 345/904, 1.1–111, 156–184, 204–215, 345/690–699; 324/770
See application file for complete search history.

(56) References Cited

U.S. PATENT DOCUMENTS

| 5,063,378 | A  | * | 11/1991 | Roach ............................. 345/90 |
| 5,781,171 | A  | * | 7/1998  | Kihara et al. .................. 345/93 |
| 5,815,129 | A  | * | 9/1998  | Jung ............................... 345/93 |
| 5,859,627 | A  | * | 1/1999  | Hoshiya et al. ............... 345/100 |
| 6,057,823 | A  | * | 5/2000  | Aoki et al. ...................... 345/99 |
| 6,064,364 | A  | * | 5/2000  | Katoh et al. ................... 345/100 |
| 6,100,865 | A  | * | 8/2000  | Sasaki ............................ 345/92 |
| 6,177,920 | B1 | * | 1/2001  | Koyama et al. ............... 345/100 |
| 6,204,836 | B1 | * | 3/2001  | Yamazaki et al. ............. 345/98 |
| 6,518,945 | B1 | * | 2/2003  | Pinkham ........................ 345/92 |
| 6,697,037 | B1 | * | 2/2004  | Alt et al. ........................ 345/93 |
| 6,747,627 | B1 | * | 6/2004  | Koyama et al. ............... 345/100 |
| 2004/0189583 | A1 | * | 9/2004 | Park et al. ...................... 345/100 |
| 2005/0078057 | A1 | * | 4/2005 | Chang et al. ................... 345/55 |
| 2005/0110738 | A1 | * | 5/2005 | Kim et al. ...................... 345/100 |
| 2007/0085809 | A1 | * | 4/2007 | Wei et al. ....................... 345/100 |

FOREIGN PATENT DOCUMENTS

KR 10-2005-0048878 A 5/2005

* cited by examiner

*Primary Examiner* — Gene W Lee
(74) *Attorney, Agent, or Firm* — McKenna, Long & Aldridge, LLP.

(57) ABSTRACT

A gate driver and a method for repairing the same are disclosed. The gate driver includes a shift register including a plurality of stages each having a respective one of a plurality of first output lines; at least one repair line connectable to the first output lines; a storage device to store information therein to identify a position of a certain stage of the plurality of stages; and a repair scan pulse generator to provide repair scan pulses to the repair line based on information stored in the storage device.

30 Claims, 5 Drawing Sheets

GATE DRIVER AND METHOD FOR REPAIRING THE SAME

This application claims the benefit of Korean Patent Application No. 2005-0119372, filed on Dec. 8, 2005 which is hereby incorporated by reference for all purposes as if fully set forth herein.

BACKGROUND OF THE INVENTION

1. Field of the Invention

The present invention relates to an LCD driving circuit, and more particularly, to a gate driver capable of repairing defective stages, and a repairing method thereof.

2. Discussion of the Related Art

A Liquid Crystal Display (LCD) device displays images by controlling light transmittance of liquid crystal using electric fields. The LCD device includes a liquid crystal display panel in which pixels are arranged in a matrix format and driving circuits for driving the LCD panel.

The LCD panel is configured such that a plurality of gate lines and a plurality of data lines orthogonally cross each other to define pixel areas within the crossings of the gate lines and the data lines. The LCD panel includes pixel electrodes and common electrodes for applying electric fields to the pixel areas.

Respective pixel electrodes are connected to the data lines via the sources and drains of thin film transistors (TFTs) employed as switching elements in each pixel. The TFTs are turned on by scan pulses applied to the gates via the gate lines to allow voltages corresponding to the data signals of the data lines to be charged to the pixel areas.

The driving circuits include a gate driver for driving the gate lines; a data driver for driving data lines; a timing controller for providing control signals for controlling the gate driver and data driver; and a power supply unit for providing various driving voltages used in the LCD device.

The timing controller serves to control driving timing of the gate driver and the data driver and to provide the pixel data to the data driver. The power supply unit serves to boost or diminish an input voltage to generate a common voltage VCOM and driving voltages for a gate high voltage signal VGH, a gate low voltage signal VGL and other voltages. In addition, the gate driver sequentially provides the scan pulses to the gate lines to sequentially drive liquid crystal cells of an LCD panel line by line. The data driver provides pixel voltage signals to each data line each time a scan pulse is provided to one of the gate lines. The light transmittance of the LCD panel is controlled by electric fields that are applied to the pixel electrodes and the common electrodes of LC cells according to the pixel voltage signals to display images on the LCD panel.

The gate driver includes a shift register to sequentially supply the above-described scan pulses.

A driving circuit of the related art will be described in detail with reference to FIG. 1.

FIG. 1 illustrates a shift register of the related art.

The shift register of the related art includes a plurality of stages ST101~ST10n+1 which are dependently connected to each other. The stages ST101~ST10n not including a dummy stage ST10n+1 sequentially output scan pulses to the gate lines included in the display unit.

Each of the stages ST101~ST10n+1 is enabled as each stage receives a scan pulse outputted from the immediately preceding stage and disabled as each stage receives a scan pulse outputted from the immediately following stage.

For example, the $2^{nd}$ stage ST102 is enabled as it inputs a scan pulse from the $1^{st}$ stage ST101 and disabled as it inputs a scan pulse from the $3^{rd}$ stage ST103.

To this end, each of the stages ST101~ST10n has three output lines 141a, 141b, and 141c, as shown in $2^{nd}$ stage ST102, for example.

The first output line 141a is electrically connected between a corresponding stage and a corresponding gate line. The second output line 141b is electrically connected between the first output line 141a and the following stage thereof. The third output line 141c is electrically connected between the first output line 141a and the preceding stage thereof.

If a defect occurs in one of the stages ST101~STn+1 such that the defective stage cannot be operated, none of the stages following the defective stage will be able to output a scan pulse.

For example, as shown in FIG. 1, when the $3^{rd}$ stage ST103 is inoperable due to a defect, it does not output a scan pulse.

In a normal state, the $4^{th}$ stage ST104 immediately following the $3^{rd}$ stage ST103 is enabled as it receives a scan pulse outputted from the $3^{rd}$ stage ST103. However, because the $3^{rd}$ stage ST103 has been rendered inoperable due to a malfunction as described above, the $4^{th}$ stage ST104 is not enabled to output a scan pulse.

Similarly, in the normal state, the $5^{th}$ stage ST105 immediately following the $4^{th}$ stage ST104 is enabled as it inputs a scan pulse outputted from the $4^{th}$ stage ST104. However, since the $4^{th}$ stage ST104 does not output a scan pulse because of the failure of the $3^{rd}$ stage, the $5^{th}$ stage ST105 cannot be enabled.

The remaining stages, from the $6^{th}$ stage to the nth stage ST10n will be similarly unable output scan pulses.

Therefore, the third to nth gate lines, which are connected to the $3^{rd}$ stage ST103 to the nth stage ST10n, cannot be operated due to the defect in the $3^{rd}$ stage. Accordingly, pixel cells connected to the $3^{rd}$ to nth gate lines cannot display images.

SUMMARY OF THE INVENTION

Accordingly, the present invention is directed to a gate driver and a method of repairing the gate driver that substantially obviates one or more problems due to limitations and disadvantages of the related art.

An advantage of the present invention is to provide a gate driver and a method for repairing the gate driver, which are capable of operating with defective stages, in which the gate driver includes at least a repair line which is crossed with the first output line, and a repair scan pulse generator for providing repair scan pulses to the repair line.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a gate driver includes: a shift register including a plurality of stages each having a respective one of a plurality of first output lines; at least one repair line connectable to the first output lines; a storage device to store information therein to identify a position of a certain stage of the plurality of stages; and a repair scan pulse generator to provide repair scan pulses to the repair line based on information stored in the storage device.

In another aspect of the present invention, a gate driver includes: a first shift register connected to first ends of gate lines, the first shift register including a plurality of first stages having a plurality of first output lines; a second shift register connected to ends of the gate lines opposite the first ends, the second shift register including a plurality of second stages having a plurality of second output lines; at least one first repair line arranged to cross the first output lines; at least one second repair line arranged to cross the second output lines; a first storage device to store information identifying a position of a certain first stage; a second storage device to store information identifying a position of a certain second stage; a first repair scan pulse generator to provide repair scan pulses to the first repair line on the based on information stored in the first storage device; and a second repair scan pulse generator to provide repair scan pulses to the second repair line on the based on information stored in the second storage device.

In another aspect of the present invention a method for repairing a gate driver including a shift register including a plurality of stages each having a respective one of a plurality of output lines and at least one repair line arranged to cross the first output line where the method includes: storing information of a position of a certain stage; connecting the output line respective to the certain stage to the repair line; and providing repair scan pulses to the repair line on the based on the stored information It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
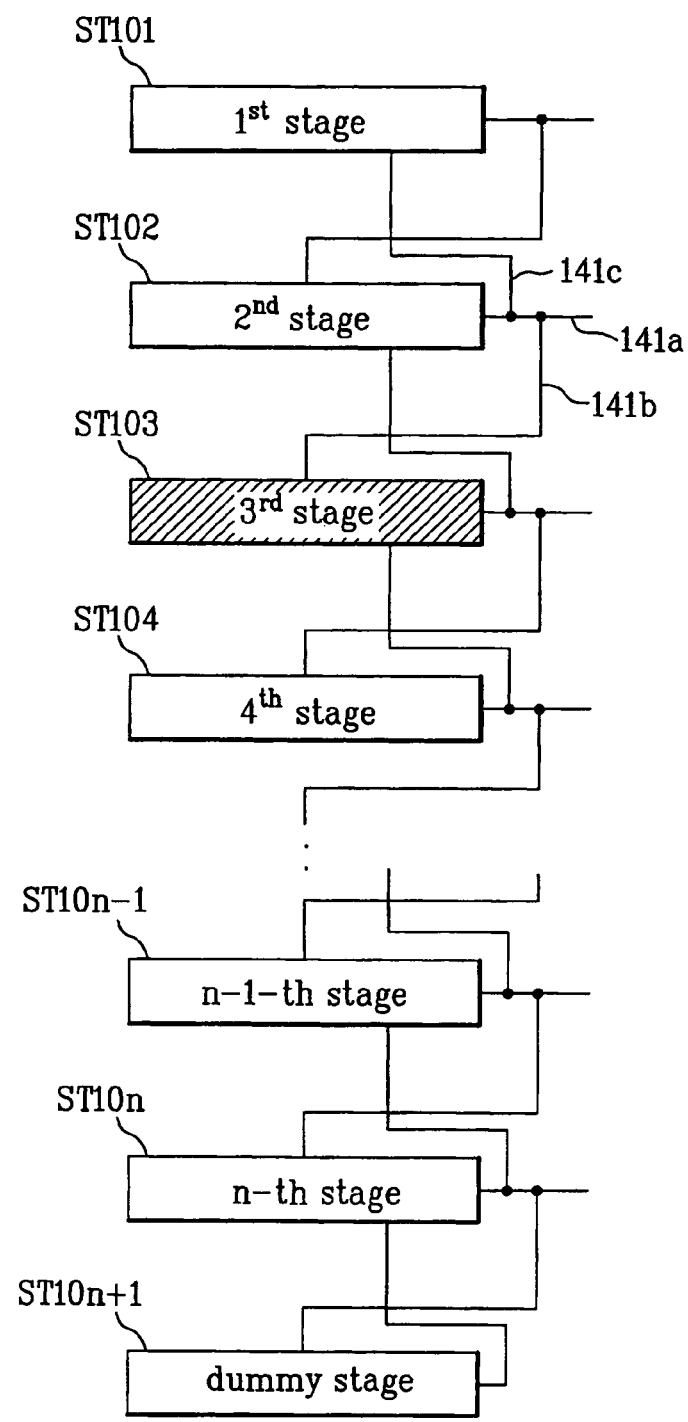
FIG. 1 illustrates a shift register of the related art.
Figure 2:
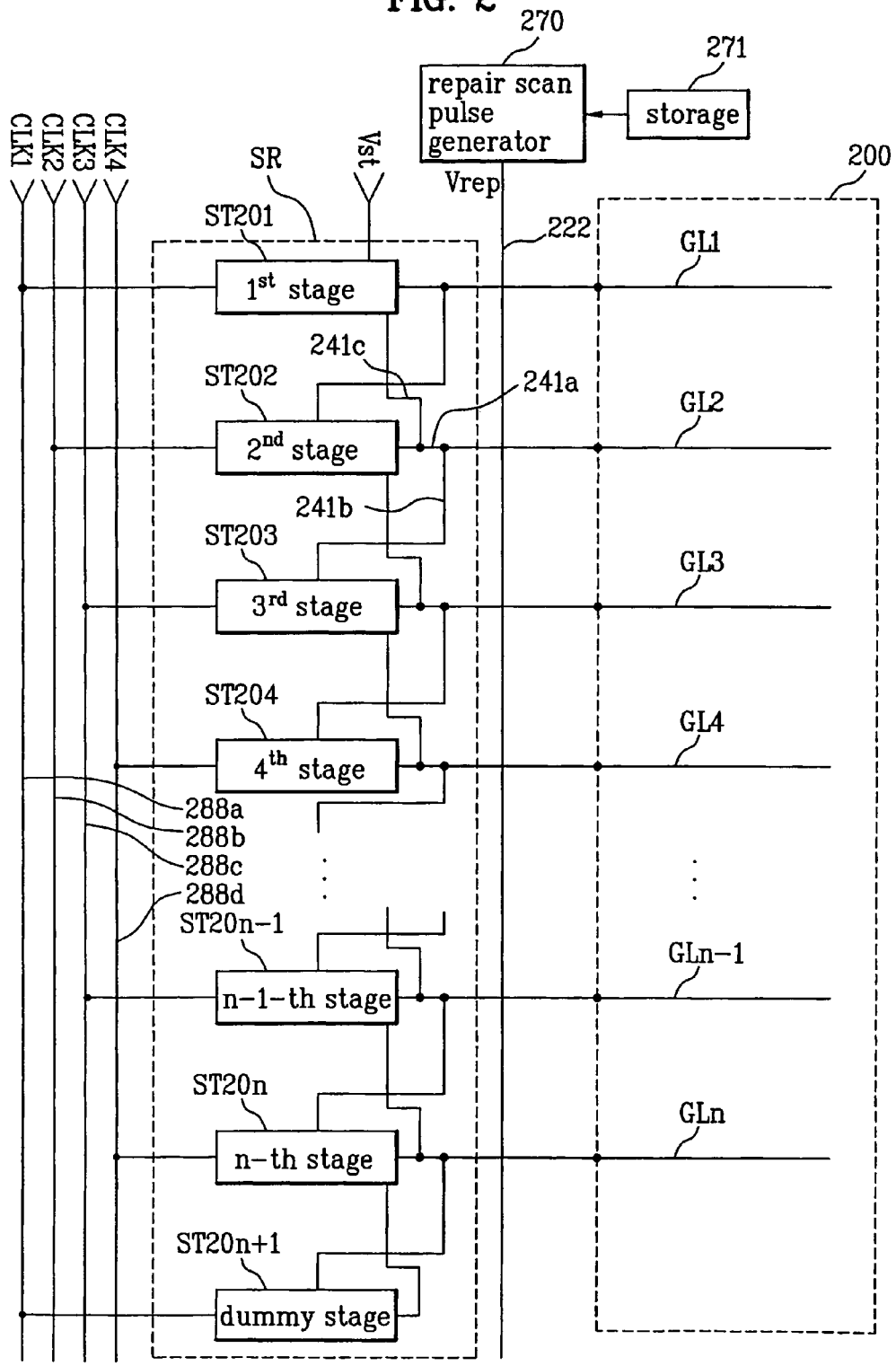
FIG. 2 illustrates a gate driver according to a first embodiment of the present invention.

FIG. 2 illustrates a gate driver according to a first embodiment of the present invention.

As shown in the drawings, the gate driver includes: a shift register SR including a plurality of stages having a plurality of first output lines 241a; a repair line 222 which is arranged such that the repair line 222 crosses each of the first output lines 241a; a storage device 271 for storing information identifying a position of a certain stage; and a repair scan pulse generator 270 for providing repair scan pulses Vrep to the repair line 222 on the basis of the information stored in the storage device 271.

Hereinafter, the above elements will be described.

The shift register SR includes $1^{st}$ to nth stages ST201~ST20n and a dummy stage ST20n+1. The shift register stages (ST201~ST20n+1) sequentially generate output scan pulses to be supplied a display unit 200 of a liquid crystal display (LCD) panel. The $1^{st}$ to nth stages ST201~ST20n (i.e. not including the dummy stage ST20n+1) each provides scan pulses to a corresponding gate line included in the display unit 200. Accordingly, the respective gate lines GL1~GLn are sequentially driven from the first gate line GL1 to the nth gate line GLn.

Each of the stages ST201~ST20n+1 is enabled in response to a scan pulse outputted from the immediately preceding stage (if any) and disabled in response to a scan pulse outputted from the immediately following stage. Each enabled stage inputs one of at least two types of clock pulses having a phase difference and provides the inputted clock pulse used as a scan pulse to a corresponding gate line. On the other hand, each disabled stage inputs an OFF power signal to provide it to a corresponding gate line such that the corresponding gate line can be deactivated.

For example, the $2^{nd}$ stage ST202 is enabled in response to the first scan pulse from the $1^{st}$ stage ST201, and disabled in response to the third scan pulse from the $3^{rd}$ stage ST203. The enabled $2^{nd}$ stage ST202 receives the second clock pulse CLK2 among the first to fourth clock pulses CLK1~CLK4 which clock of the first to fourth clock pulses having a different phase, and provides the second clock pulse CLK2 as a second scan pulse to the second gate line GL2.

To this end, each of the stages (ST202~ST20n) except for the stages ST201 and the dummy stage ST20n+1 has first to third output lines 241a~241c as shown in stage ST202, for example.

The first output line 241a is electrically connected between a corresponding stage and a corresponding gate line. The second output line 241b is electrically connected between the first output line 241a and the following stage thereof. The third output line 241c is electrically connected between the first output line 241a and the preceding stage thereof.

For example, the first output line 241a of the $2^{nd}$ stage ST202 electrically connects the $2^{nd}$ stage ST202 to the second gate line GL2. The second output line 241b of the $2^{nd}$ stage ST202 electrically connects the first output line 241a of the $2^{nd}$ stage ST202 to the $3^{rd}$ stage ST203. The third output line 241c of the $2^{nd}$ stage ST202 electrically connects the first output line 241a of the $2^{nd}$ stage ST202 to the $1^{st}$ stage ST201.

Since the $1^{st}$ stage ST201 does not have a preceding stage, the $1^{st}$ stage ST201 has first and second output lines 241a and 241b but does not have a third output line 241c.

In addition, since the dummy stage ST20n+1 does not have a following stage and does not supply scan pulses to a gate line, the dummy stage ST20n+1 has a third output line 241c and does not have either a first output line 241a for supplying a gate line or a second output line 241b.

In an alternative configuration of the shift register each of the stages (ST201~ST20n) can be disabled through the clock pulses as each stage inputs one of the above-described clock pulses. In this alternative configuration, each of the stages (ST201~ST20n) has only first and second output lines 241a and 241b does not need a third output line 241c to perform the disabling function. Further, the dummy stage may be omitted from the shift register SR and the nth stage ST20n included in the shift register SR may have only the first output line 241a.

Although the repair line 222 is arranged to cross the first output lines 241a, an isolation film is formed therebetween electrically isolating the repair line 222 from the first output lines 241a.

One end of the repair line 222 is connected to the repair scan pulse generator 270. The repair scan pulse generator 270 reads information stored in the storage device 271 and controls the output timing of the repair scan pulse Vrep based on the information read from the storage device.

The storage device 271 according to an embodiment of the present invention may be implemented with a programmable read only memory (PROM) or with other types of storage devices such as random access memory (RAM). The storage device 271 stores information identifying a position of a malfunctioning stage of the shift register SR.

The repair scan pulse generator 270 selects one of at least two clock pulses whose phases are different from one another to be used as a repair scan pulse Vrep. The repair scan pulse generator 270 reads the information stored in the storage device 271 and selects one of the clock pulses based on the read result.

In other words, the repair scan pulse generator 270 reads the information stored in the storage device 271 to identify which stage is presently in a malfunctioning state and then determines a clock pulse to be provided for the malfunctioning stage. In other words, the repair scan pulse generator 270 outputs a scan pulse (i.e., a repair scan pulse Vrep) in the stead of the malfunctioning stage.

The repair scan pulse generator 270 outputs a clock pulse once each frame. The clock pulses, which are repeatedly outputted each period, are inputted to the repair scan pulse generator 170. The repair scan pulse generator 270 does not output the selected clock pulse each period, but outputs the selected clock pulse once each frame. Therefore, a clock pulse (i.e., a repair scan pulse Vrep) is supplied to the repair line 222 once each frame.

For example, when the repair scan pulse generator 270 inputs first to fourth clock pulses CLK1~CLK4 and the $3^{rd}$ stage ST203 is in a malfunctioning state, the storage device 271 stores information identifying the position of the $3^{rd}$ stage ST203. The repair scan pulse generator 270 reads the information stored in the storage device 271 and based on the information read, selects the third clock pulse CLK3 to be provided to the $3^{rd}$ stage ST203.

The third clock pulses CLK3 are outputted at a constant period. The repair scan pulse generator 270 selects one of the third clock pulses CLK3 at a particular period, and then outputs the selected third clock pulse CLK3 used as a repair scan pulse Vrep.

The start time of the particular period corresponds to a start time when the malfunctioning $3^{rd}$ stage ST203 is designed to output a scan pulse.

The gate driver according to the embodiment of the present invention is implemented with four clock pulses CLK1~CLK4, in which adjacent clock pulses of the four clock pulses have a phase difference of one clock pulse width.

The first to fourth clock pulses CLK1~CLK4 are outputted from the timing controller and then amplified. The amplified first to fourth clock pulses CLK1~CLK4 are provided to the respective stages through the first to fourth clock transmission lines 288a~288d.

The repair scan pulse generator 270 will be described in detail with reference to FIG. 3.

Figure 3:
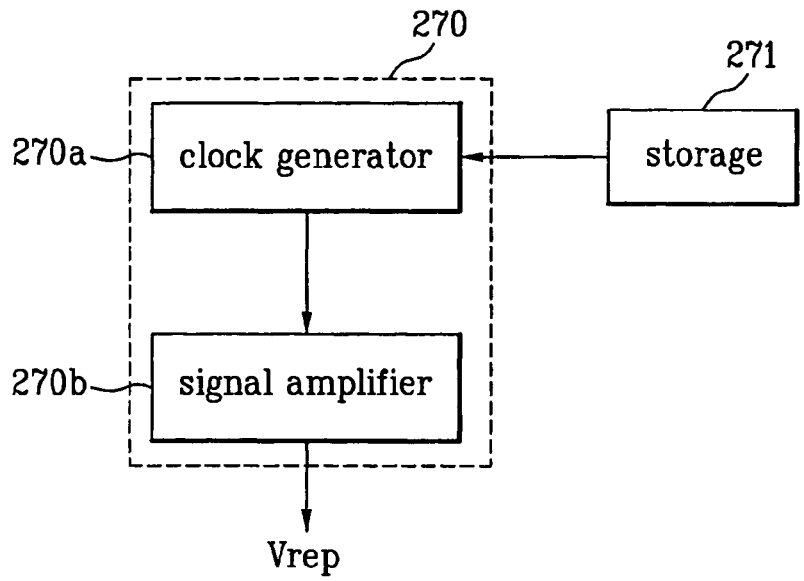
FIG. 3 illustrates a schematic block diagram of a repair scan pulse generator of the gate driver of FIG. 2.

FIG. 3 illustrates a schematic block diagram of a repair scan pulse generator of FIG. 2.

As shown in FIG. 3, the repair scan pulse generator 270 includes a clock generator 270a for reading information stored in the storage device 271 and for selecting and outputting one of the first to fourth clock pulses CLK1~CLK4 based on the read result; and a signal amplifier 270b for amplifying a clock pulse from the clock pulse generator 270a to output the selected clock pulse thereto. The clock pulse outputted from the signal amplifier 270b is provided to the repair line 222 to be used as a repair scan pulse Vrep.

The signal amplifier 270b serves to boost a voltage level of the clock pulse to a level for driving the gate line.

Figure 4:
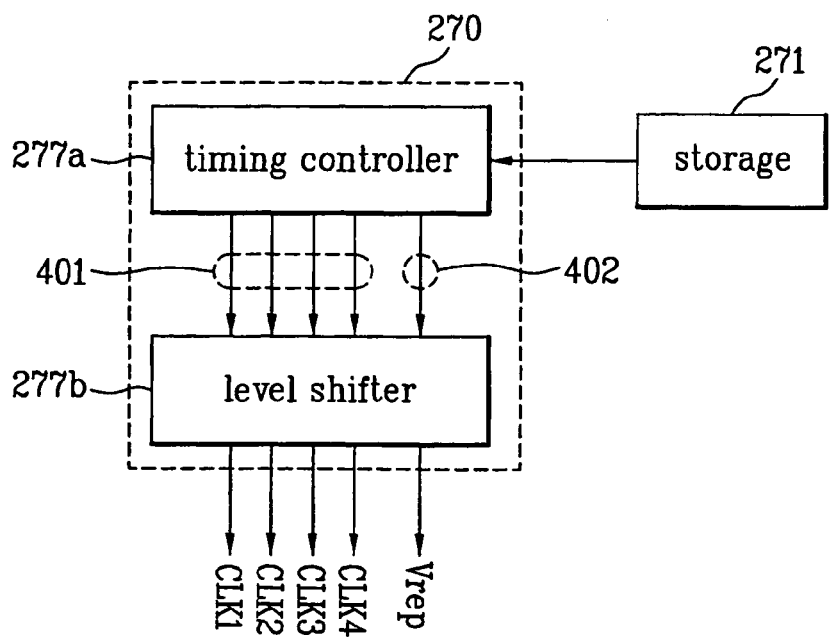
FIG. 4 illustrates a schematic block diagram of a modified repair scan pulse generator of the gate driver of FIG. 2.

FIG. 4 illustrates a schematic block diagram of a modified repair scan pulse generator of FIG. 2, which includes a timing controller 277a and a level shifter 277b.

The timing controller 277a outputs the first to fourth clock pulses CLK1~CLK4 through four first output transmission lines 401. In addition, the timing controller 277a selects one of the first to fourth clock pulses CLK1~CLK4 based on the information stored in the storage device 271 and then outputs the selected clock pulse CLKm to a second output transmission line 402.

The first to fourth clock pulses, which are outputted through the four first output transmission lines 401, and the clock pulse CLKm, which is outputted from the single second output transmission line 402, are provided to the level shifter 277b. In particular, the first to fourth clock pulses CLK1~CLK4, which are outputted through the first transmission line 401, are provided to the level shifter 277b several times per frame. The clock pulse CLKm outputted from the second output transmission line 402 is provided to the level shifter 277b once per frame.

The level shifter 277b boosts voltage levels of the first to fourth clock pulses CLK1~CLK4 provided thereto through the first output transmission line 401 and of the clock pulse CLKm provided thereto through the second output transmission line 402. The clock pulses with boosted voltage levels are and then outputted by the level shifter 277b. The level shifter 277b provides the first to fourth clock pulses CLK1~CLK4 with boosted voltage levels to the first to fourth clock transmission lines 288a~288d. In addition, the level shifter 277b provides the clock pulse CLKm with boosted voltage level to the repair line 222 as Vrep.

The following is a description for a method for repairing the gate driver according to the first embodiment of the present invention, in which a stage is in a malfunctioning state due to a defect.

Figure 5:
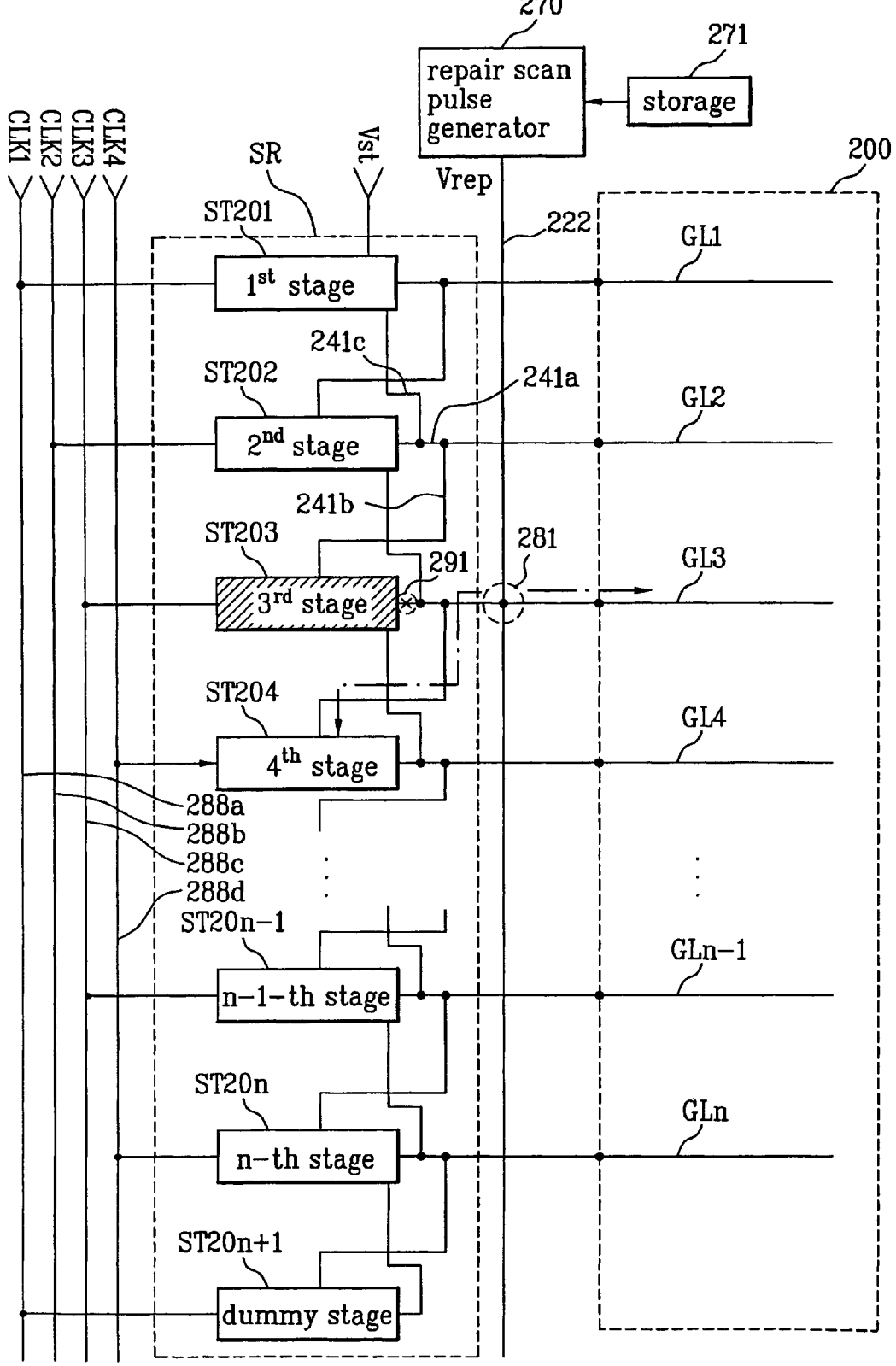
FIG. 5 is a schematic block diagram of the gate driver illustrating a method for repairing the gate driver when the third stage of the shift register of FIG. 2 is inoperable.

FIG. 5 illustrates a schematic block diagram of the gate driver to describe a method for repairing the gate driver when the third stage of the shift register of FIG. 2 is inoperable.

As shown in FIG. 5, when the $3^{rd}$ stage ST203 of the shift register SR is in a malfunctioning state, the $3^{rd}$ stage ST203 does not generate any output. In FIG. 5, the $1^{st}$ and $2^{nd}$ stages ST201 and ST202 operate normally such that the first and second gate lines GL1 and GL2 can be also operated. Because the $3^{rd}$ stage ST203 is in a malfunctioning state, the $3^{rd}$ stage ST203 and the $4^{th}$ stage ST204 through the dummy stage ST20n+1 following the $3^{rd}$ stage ST203 are not enabled by the $3^{rd}$ state to output scan pulses. Therefore, absent a repair, the third to nth gate lines GL3~GLn connected to the $3^{rd}$ to nth stages ST203~ST20n do not receive scan pulses.

In order to repair the gate driver, information identifying a position of the stage in a malfunctioning state is first stored in the storage device 271.

The first output line 241a connected to the stage in a malfunctioning state, (e.g. the $3^{rd}$ stage ST203 as shown in FIG. 5) is then electrically connected to the repair line 222.

The electrical connection of an output line 241a to the repair line 22 may be made by laser wielding a cross point between the repair line 222 and the first output line 241a connected to the 3$^{rd}$ stage ST203.

The 3$^{rd}$ stage ST203 can be electrically separated or disconnected from the first output line 241a. The electrical disconnection between the output lead of the malfunctioning 3$^{rd}$ stage ST203 and the first output line 241a may be achieved by removing the contact point therebetween using a laser. The electrical disconnection may prevent a distorted signal from the malfunctioning 3$^{rd}$ stage ST203 from being provided to the third gate line GL3.

Therefore, the repair line 222 is connected electrically through the cross point 281 to the first output line 241a of the 3$^{rd}$ stage ST203, the third gate line GL3 is connected to the first output line 241a, the second output line 241b is connected to the first output line 241a of the 3$^{rd}$ stage ST203 and the third output line 241c is connected to the first output line 241a of the 3$^{rd}$ stage ST203.

When the gate driver, which is repaired as described above, is operated, the 1$^{st}$ stage ST201 is enabled in response to the first clock transmission line 288a. The enabled 1$^{st}$ stage ST201 receives the first clock pulse CLK1 from the first clock transmission line 288a and then outputs the first clock pulse CLK1 to be used as a first scan pulse. The first scan pulse is provided to the first gate line GL1 through the first output line 241a and to the 2$^{nd}$ stage ST202 through the first and second output lines 241a and 241b.

The 2$^{nd}$ stage ST202 is enabled in response to the first scan pulse from the 1$^{st}$ stage ST201. The enabled 2$^{nd}$ stage ST202 receives the second clock pulse CLK2 from the second clock transmission line 288b and then outputs the second clock pulse CLK2 to be used as a second scan pulse. The second scan pulse is provided to the second gate line GL2 though the first output line 241a, and to the 3$^{rd}$ stage ST203 through the first and second output lines 241a and 241b. In addition, the second scan pulse is provided to the 1$^{st}$ stage ST201 through the first and third output lines 241b and 241c.

Since the 3$^{rd}$ stage ST203 is in a malfunctioning state, although it receives the second scan pulse from the 2$^{nd}$ stage ST202, it cannot output a third scan pulse.

When a third clock pulse CLK3 is outputted, or when the third clock pulse CLK3 is provided to the 3$^{rd}$ clock transmission line 288c, the repair scan pulse generator 270 also outputs a third clock pulse CLK3, and provides the third clock pulse CLK3 for use as a repair scan pulse Vrep to the repair line 222. The timing for outputting the clock pulse in the repair scan pulse generator 270 is controlled based on the information stored in the storage device 271.

The repair scan pulse Vrep is provided to the repair line 222, which is connected to the third gate line GL3 through the crossing point 281. The repair scan pulse Vrep is then provided to the 2$^{nd}$ stage ST202 through the crossing point 281 to disable the 2$^{nd}$ stage ST202, to the first output line 241a connected to the 3$^{rd}$ stage ST203, and to the third output line 241c connected to the first output line 241a. In addition, the repair scan pulse Vrep is provided to the 4$^{th}$ stage ST203 through the crossing point 281, the first output line 241a connected to the 3$^{rd}$ stage ST203, and the second output line 241b connected to the first output line 241a. Therefore, the 4$^{th}$ stage ST204 can be enabled.

Accordingly, the 4$^{th}$ stage ST204 to the dummy stage ST20n+1 can sequentially output scan pulses.

Figure 6:
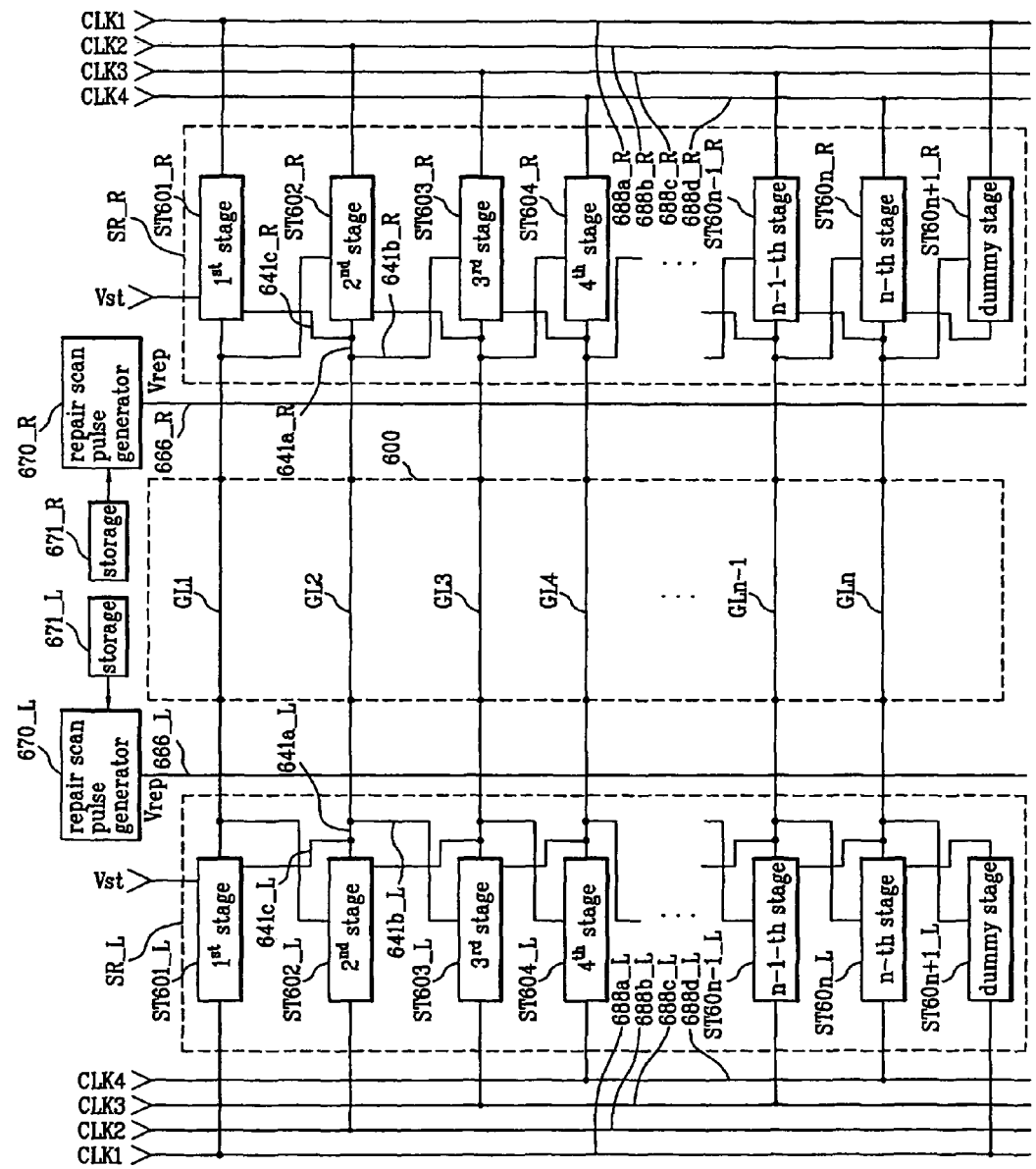
FIG. 6 illustrates a gate driver according to a second embodiment of the present invention.

A description for a gate driver according to a second embodiment of the present invention is provided hereinafter with reference to FIG. 6.

The gate driver according to the second embodiment is configured such that gate lines of two gate drivers of FIG. 2 are correspondingly connected to each other.

A first shift register SR_R is connected to one ends of gate lines GL1~GLn included in a display unit 600, through first output lines 641a_L. The first output lines 641a_L cross with repair line 666_L positioned thereon.

The first shift register SR_L includes a dummy stage ST60n+1_L, and a plurality of stages ST601_L~ST60n_L, which are connected to ends of the gate lines GL1~GLn.

One end of the repair line 666_L is connected to the repair scan pulse generator 670_L. The repair scan pulse generator 670_L controls a timing of outputting the repair scan pulse Vrep based on information stored in a storage device 671_L.

On the other hand, a second shift register SR_R is connected to another ends of the gate lines GL1~GLn included in the display unit 600 through the first output lines 641a_R. The first output lines 641a_R cross with a repair line 666_R positioned thereon.

The second shift register SR_R includes a dummy stage ST60n+1_R, and a plurality of stages ST601_R~ST60n_R, which are connected to ends of the gate lines GL1~GLn opposite to the ends connected to stages ST601_L~ST60n_L)

One end of the repair line 666_R is connected to the repair scan pulse generator 670_R. The repair scan pulse generator 670_R controls a timing of outputting the repair scan pulse Vrep based on information stored in a storage device 671_R.

The method for repairing the gate driver according to the second embodiment of the present invention is the same that as the gate driver of the first embodiment.

Additionally, the first and second embodiments of the present invention can repair two or more than two stages in a malfunctioning state using two or more than two repair lines (222, 666_L, and 666_R). To this end, the repair scan pulse generators 270, 670_L, 670_R output two or more than two clock pulses, and then provides the outputted clock pulses to the repair lines 222, 666_L, and 666_R, respectively.

The storage devices 271, 671_L, and 671_R store information of each of positions of stages in a malfunctioning state. In addition, the respective repair lines 222, 666_L, and 666_R are electrically connected to the first output lines 241a connected to the stages in a malfunctioning state.

As described above, the gate driver according to the present invention stores information identifying positions of the stages in a malfunctioning state in a storage device and provides scan pulses according to the stored information, such that stages in a malfunctioning state can be repaired.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A gate driver comprising:
   a shift register including a plurality of stages each having a respective one of a plurality of first output lines;
   a repair line crossing the first output lines, wherein electrical connection of a certain first output line to the repair line is made by welding a cross point between the certain first output line and the repair line;
   a storage device to store information therein to identify a position of a certain stage of the plurality of stages, wherein the certain stage is a malfunctioning stage; and
   a repair scan pulse generator to provide repair scan pulses to the repair line based on information stored in the storage device;
   wherein the repair scan pulse generator includes a clock generator to select one of a plurality of clock pulses based on information stored in the storage device and to output the selected clock pulse; and a signal amplifier to amplify the clock pulse output by the clock generator and to provide the amplified clock pulse as a repair scan pulse to the repair line;

wherein the clock generator is arranged to output the clock pulse once each frame.

2. The gate driver as set forth in claim 1, wherein one end of the nth first output line of the plurality of first output lines is connected to an nth respective stage and the opposite end of the nth first output line is connected to an nth gate line, wherein n is a positive integer.

3. The gate driver as set forth in claim 1, further comprising a second output line to provide scan pulses outputted from the (n−1)th stage to the nth stage, wherein n is a positive integer and greater than 2.

4. The gate driver as set forth in claim 3, wherein the second output line is connected to the first output line connected to the (n−1)th stage and to the nth stage.

5. The gate driver as set forth in claim 3, further comprising a third output line to provide scan pulses outputted from the (n+1)th stage to the nth stage.

6. The gate driver as set forth in claim 5, wherein the third output line is connected to the first output line connected to the (n+1)th stage and to the nth stage.

7. The gate driver as set forth in claim 1, wherein the clock generator includes a timing controller.

8. The gate driver as set forth in claim 1, wherein the signal amplifier includes a level shifter.

9. The gate driver as set forth in claim 1, wherein the storage device includes a programmable read only memory (PROM).

10. The gate driver as set forth in claim 1, wherein the certain first output line is separated from the respective stage of the plurality of stages.

11. The gate driver as set forth in claim 1, further comprising a third output line to provide scan pulses outputted from the (n−1)th first stage to the nth first stage, wherein n is a positive integer and greater than 2.

12. The gate driver as set forth in claim 11, wherein the third output line is connected to the first output line of the (n−1)th first stage and to the nth first stage.

13. The gate driver as set forth in claim 11, further comprising a fourth output line to provide scan pulses output from the (n+1)th first stage, to the nth first stage.

14. The gate driver as set forth in claim 13, wherein the fourth output line is connected to the first output line connected to the (n+1)th first stage, and the nth first stage.

15. The gate driver as set forth in claim 1, wherein certain first output line is separated from a stage.

16. A gate driver comprising:
a first shift register connected to first ends of gate lines, the first shift register including a plurality of first stages having a plurality of first output lines;
a second shift register connected to second ends of the gate lines opposite the first ends, the second shift register including a plurality of second stages having a plurality of second output lines;
a first repair line arranged to cross the first output lines, wherein electrical connection of a certain first output line to the first repair line is made by welding a cross point between the certain first output line and the first repair line;
a second repair line arranged to cross the second output lines, wherein electrical connection of a certain second output line to the second repair line is made by welding a cross point between the certain second output line and the second repair line;
a first storage device to store information identifying a position of a certain first stag;
wherein the certain first stage is a malfunctioning stage;
a second storage device to store information identifying a position of a certain second stage, wherein the certain second stage is a malfunctioning stage;
a first repair scan pulse generator to provide repair scan pulses to the first repair line based on information stored in the first storage device; and
a second repair scan pulse generator to provide repair scan pulses to the second repair line based on information stored in the second storage device;
wherein the first repair scan pulse generator includes a first clock generator to select one of a plurality of clock pulses based on the information of the first storage device and to output the selected clock; and a first signal amplifier to amplify the clock pulse from the first clock generator and to provide the amplified clock pulse as a repair scan pulse to the first repair line;
wherein the first clock generator is arranged to output the clock pulse once each frame;
wherein the second repair scan pulse generator includes a second clock generator to select one of a plurality of clock pulses based on information stored in the second storage device and to output the selected clock thereto; and a second signal amplifier to amplify the clock pulse from the second clock generator and to provide the amplified clock pulse as a repair scan pulse to the second repair line;
wherein the second clock generator is arranged to output the clock pulse once each frame.

17. The gate driver as set forth in claim 16, wherein one end of the nth first output line is connected to the respective nth first stage and the opposite end of the nth first output line is connected to one end of nth gate line, wherein n is a positive integer.

18. The gate driver as set forth in claim 16, wherein the first and second storage devices include a programmable read only memory (PROM).

19. The gate driver as set forth in claim 16, wherein one end of the nth second output line is connected to the nth second stage and the opposite end of the nth second output line is connected to the second end of nth gate line, wherein n is a positive integer.

20. The gate driver as set forth in claim 16, further comprising a third output line to provide scan pulses output from the (n−1)th second stage to the nth second stage, wherein n is a positive integer and greater than 2.

21. The gate driver as set forth in claim 20, wherein the third output line is connected to the second output line connected to the (n−1)th second stage and to the nth second stage.

22. The gate driver as set forth in claim 20, further comprising a fourth output line to provide scan pulses output from the (n+1)th second stage to the nth second stage.

23. The gate driver as set forth in claim 22, wherein the fourth output line is connected to the second output line connected to the (n+1)th second stage and to the nth second stage.

24. The gate driver as set forth in claim 16, wherein the first and second clock generators includes a timing controller.

25. The gate driver as set forth in claim 16, wherein the first and second signal amplifiers includes a level shifter.

26. The gate driver as set forth in claim 16, wherein the second repair line is connected to a certain second output line.

27. The gate driver as set forth in claim 26, wherein the certain second output line is separated from a second stage.

28. A method for repairing a gate driver including a shift register having a plurality of stages each stage having a respective one of a plurality of output lines and a repair line arranged to cross the output lines, the method comprising:
- storing information of a position of a certain stage, wherein the certain stage is a malfunctioning stage;
- connecting the output line respective to the certain stage to the repair line;
- selecting one of a plurality of clock pulses based on information stored in the storage device;
- amplifying the selected clock pulse; and
- providing the amplified clock pulse as a repair scan pulse to the repair line.

29. The method as set forth in claim 28, wherein the certain output line is an output line connected to the certain stage.

30. The method as set forth in claim 28, further comprising: separating the respective output line from the certain stage.

* * * * *